United States Patent [19]

Fouere et al.

[11] Patent Number: 5,268,922
[45] Date of Patent: Dec. 7, 1993

[54] LASER DIODE ASSEMBLY

[75] Inventors: Jean-Claude Fouere, Poughkeepsie; Claude Metreaud, Fishkill, both of N.Y.

[73] Assignee: International Business Machines Corporation, Armonk, N.Y.

[21] Appl. No.: 786,235

[22] Filed: Oct. 31, 1991

[51] Int. Cl.⁵ .............................................. H01S 3/08
[52] U.S. Cl. ........................................ 372/98; 385/33
[58] Field of Search ..................... 357/74; 385/33, 35; 372/101, 98

[56] References Cited

U.S. PATENT DOCUMENTS

| | | | |
|---|---|---|---|
| 4,003,074 | 1/1977 | Yonezu et al. | 357/74 |
| 4,366,492 | 12/1982 | Kitamura | 346/160 |
| 4,567,598 | 1/1986 | Noguchi et al. | 372/36 |
| 4,661,959 | 4/1987 | Kaneko | 372/34 |
| 4,763,334 | 8/1988 | Shimada et al. | 372/29 |
| 4,787,088 | 11/1988 | Horikawa | 372/34 |
| 4,842,391 | 6/1989 | Kim et al. | 385/35 |
| 5,048,912 | 9/1991 | Kunikane et al. | 385/35 |
| 5,058,124 | 10/1991 | Cameron et al. | 357/74 |
| 5,121,451 | 6/1992 | Grard et al. | 385/33 |

FOREIGN PATENT DOCUMENTS

| | | |
|---|---|---|
| 56-69882 | 6/1981 | Japan . |
| 59-193080 | 11/1984 | Japan . |
| 60-95987 | 5/1985 | Japan . |
| 60-154690 | 8/1985 | Japan . |
| 60-257584 | 12/1985 | Japan . |
| 61-1077 | 1/1986 | Japan . |
| 61-1078 | 1/1986 | Japan . |

*Primary Examiner*—Rodney B. Bovernick
*Assistant Examiner*—Robert E. Wise
*Attorney, Agent, or Firm*—Harold Huberfeld; Donald M. Boles

[57] ABSTRACT

A method and apparatus for producing a laser diode assembly package is taught. Briefly stated, in a first embodiment, a housing having an access area at one end has a laser mounted therein. A collimator lens is placed at the other end of the housing and is movable along the optical axis of the laser output. This enables the collimator to be adjusted along the optical axis in order to produce an optimum amount of collimated light, with the housing and lens then be hermetically sealed with UV curable epoxy. In an alternate embodiment, the laser is mounted on a socket module which is then inserted into the housing.

13 Claims, 1 Drawing Sheet

LASER DIODE ASSEMBLY

FIELD OF THE INVENTION

This invention relates, generally, to Laser Diodes and more particularly to a laser diode collimator assembly.

BACKGROUND OF THE INVENTION

With the increased use of optical communication links and storage devices there is an increasing need to produce faster, lower cost and more power-efficient optical laser diode collimator assemblies. While initially light emitting diodes were utilized for optical links, they have never been practical for optical storage devices, while the use of laser diodes for communication links is increasing dramatically.

One of the requirements of laser diode collimator assemblies is the great precision with which they must be mounted in a package for optical collimation. As is well known, small misalignments can significantly optical degrade performances. This therefore, results in sometimes expensive and elaborate manufacturing costs, processes, and schemes, in order to ensure accurate alignment.

One such scheme may be found in U.S. Pat. No. 4,787,088 "Semiconductor Laser Beam Source Apparatus" issued Nov. 22, 1988 to Horikawa. This device provides a laser beam case which tries to protect the face of the laser from atmospheric exposure and contamination. However, this is somewhat unsatisfactory in that significant extra apparatus such as heaters and the like are needed in order to maintain proper ambient conditions.

U.S. Pat. No. 4,567,598 "Optoelectronic Semiconductor Devices in Hermetically Sealed Packages" issued Jan. 28, 1986 to Noguchi et al. discloses a hermetically sealed device. Unfortunately encompassed within this device is a significant number of components and it is therefore difficult to manufacture and optically tune the laser to the housing. U.S. Pat. No. 4,366,492 "Semiconductor Laser Device" issued Dec. 28, 1982 to Kitamura discloses a Semiconductor Laser and utilizes a metal cap or casing to house the laser. The purpose of the housing is to effectively suppress stray light emitted from the laser.

U.S. Pat. No. 4,003,074 "Hermetically Sealed Injection Semiconductor Laser Device" issued Jan. 11, 1977 to Yonezu et al. discloses another hermetically sealed laser device. However, this device is quite complex in structure with a significant number of components, thereby making it difficult to manufacture.

It is therefore an object and advantage of the present invention to produce a hermetically sealed laser package. Another object is to produce a laser package which has a minimal number of components. Yet another object and advantage is the production of a device which allows the laser package to be tuned so as to maximize the collimation of the light beam emanating from the package.

Accordingly, it is an object and an advantage of the present invention to produce a laser diode assembly comprising a laser diode for producing optical energy, a lens for collimating light produced by the laser diode means, and a housing having the diode disposable therein and having the lens optically adjustable with respect to the diode and being mountable within the housing.

DETAILED DESCRIPTION OF THE PREFERRED EMBODIMENT

Figure 1:
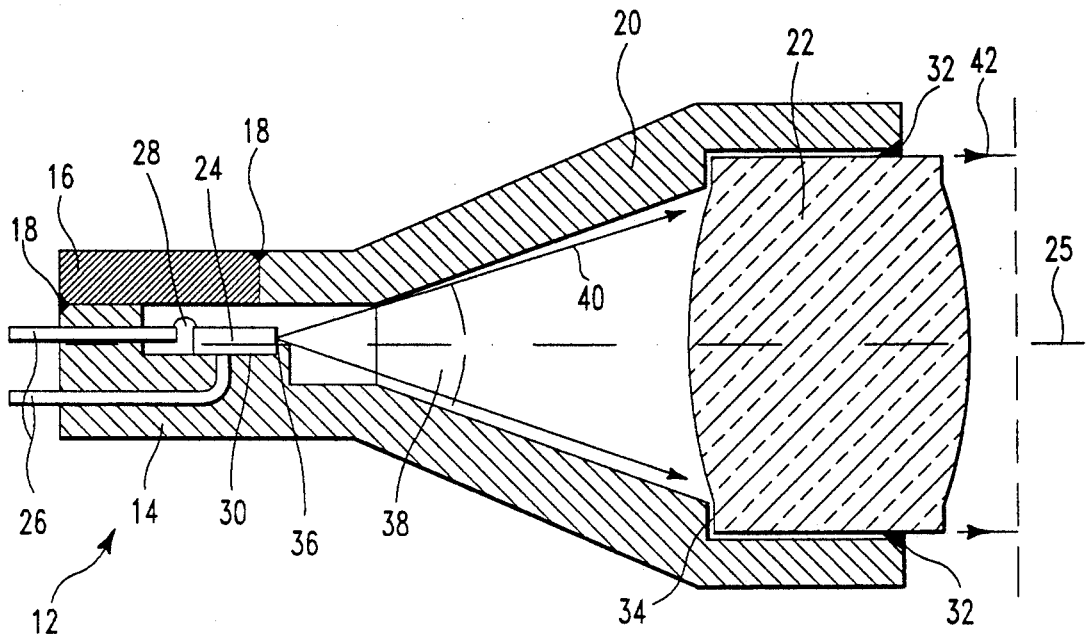

Referring now to FIG. 1, there is shown a cross-sectional view of a collimator assembly 10 of the present invention. The collimator assembly 10 is comprised of three major components: a housing 12; a collimator 22; and a laser diode 24. The housing 12 is comprised of a main assembly 14 and an access plate or cap 14. In this manner the housing is effectively a single component which greatly facilitates manufacturing. Additionally it allows the remaining two major components, the collimator 22 and the laser 24 to be directly mounted thereon. This will effectively minimize differences in thermal coefficients between the three groups and hence provides a thermally stable environment.

The cap 16 allows access to an interior area of the main assembly 14. Cap 16 is attached to main assembly 14 by use of an hermetic seal 18, thereby providing an interior space which may be maintained as free from ambient external contamination. The housing 12 and hence main assembly 14 are preferably circular although configurations such as polygonal or square may be used. Main assembly 14 is funnel shaped and therefore has disposed at one end a cone area or sleeve 20. The overall interior dimensions of the sleeve area 20 and also the overall length of the collimator assembly is necessarily sized for the optical characteristics of the laser 24 and the collimator 22.

Laser diode chip 25 is mounted on a chip mounting area 30 through any suitable adhesive or solder. In this regard the housing 12 made be made of any suitable material such as, for example, metal or ceramic. A wire lead 28 electrically connects the laser 24 with one of the pins 26. The remaining pin 26, preferably would be directly connected to the laser 24. In the preferred embodiment of the present invention, the pins 26 are molded into and are effectively a part of main assembly 14. However, it is to be understood that pins 26 may each be wire bonded to the appropriate area of laser 24.

Laser 24 in being mounted on chip mounting area 30, is also mounted adjacent chip stop 36. Chip stop 36, although not necessary, is preferably used for providing rapid and correct orientation and mounting of the laser 24 in the main assembly. This therefore allows for the setup of optical axis 25. Thereafter, all "tuning" as described below, is made with respect to axis 25.

Collimator 22 is mounted in main assembly 14 and is maintained in housing 14 by use of collimator hermetic seal 32. In the preferred embodiment of the present invention, seal 32 is a UV curable adhesive, although other types of adhesives can and may be used. A collimator stop 34 is provided as a backstop for collimator 22.

Accordingly, during assembly of the collimator assembly 10, the laser chip 24 is mounted in main assembly 14 on chip mounting area 30, adjacent chip stop 36. Thereafter, wire lead 28 would be attached and collimator 22 would be placed into the end of cone area 38. Laser 24 would then be energized and the optical energy along optical axis 25 would be viewed. This may be done by a number of methods and devices, all of which are readily know to one skilled in the art. Thereafter, collimator 22 would be adjusted along axis 25 in order to focus divergent light beam 40, emanating from laser 24 into a convergent light beam 42. In this fashion the assembly 10 may be "tuned". Once the alignment had been accomplished, collimator hermetic seal 32 would be applied.

Figure 2:
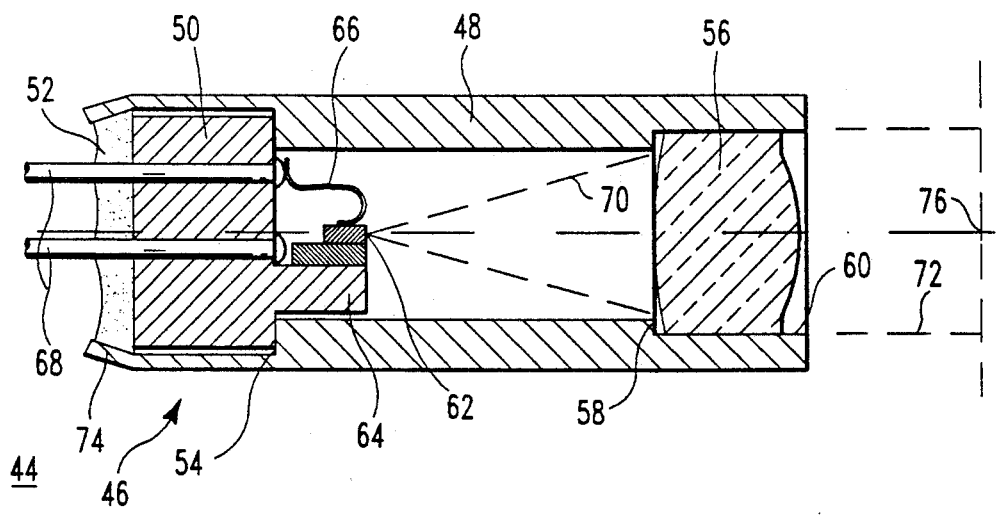

Referring now to FIG. 2, there is shown an alternate embodiment of the present invention. Shown is a cross-sectional view taken through collimator assembly 44. In this embodiment, there are again three main components: housing 46, socket 50 and collimator lens 56. Socket 50 is used to mount and electrically interconnect laser 62. Accordingly, socket 50 has a mounting shelf 64 on which chip 62 is mounted. Pins 68 are preferably molded into socket 50 with wire lead 66 interconnecting a pin 68 with laser 62. In this fashion the optical axis 76 may be readily established.

Once laser 62 is mounted, socket 50 is inserted into housing 46. The rear end of housing 46 has a socket stop 54 which helps orient socket 50 within housing 46. The rear end of housing 46 is designed so that a crimp area 74 is provided. Accordingly, once the socket 50 is inserted into housing 46, crimp area 74 is crimped as shown, thereby providing a mechanical means of holding socket 50 in housing 46. Thereafter, epoxy 52 is applied at the socket-crimp interface, thereby providing an excellent hermetic seal.

Collimator lens 56 is then inserted into the face end of housing 46, with collimator stop 58 providing a stop for the minimum distance between lens 56 and laser 62. Preferably, UV curable epoxy 60 is applied along the interface between lens 56 and housing 46 with lens 56 inserted thereafter. However, epoxy 60 or any other suitable adhesive, may be applied after insertion of lens 56 into housing 46.

Upon insertion of lens 56, laser 62 is energized which in turn produces divergent light 70. The light exiting collimator lens 56 is then measured and lens 56 is adjusted so as to produce optimum divergent light 72 passing through lens 56. In the preferred embodiment of the present invention, UV curable epoxy 60 is then cured thereby forming a somewhat monolithic assembly 10.

It is to be understood that in the preferred embodiment of the present invention that housing 12 is comprised of metal and the thermal coefficients of any adhesive or epoxies or solder are as close as possible to the thermal coefficients of the housing 46 and socket 50. However, other materials such as plastic and ceramic can and may be utilized. Further, in the preferred embodiment the collimator lens used is a bi-aspheric lens, although a multi (spherical) lens may be used molded from either glass or plastic. As mentioned a single bi-aspheric lens is preferred since they have a well defined mechanical axis which is very close to the true optical axis, thereby aiding in alignment.

What is claimed is:

1. A laser diode assembly, comprising:
    laser diode means for producing optical energy;
    lens means for collimating light produced by said laser diode means; and
    a bifurcated housing means having said diode disposable therein and having said lens optically adjustable with respect to said diode and being mountable within said housing.

2. A device according to claim 1 wherein said housing is comprised of a first housing part having an aperture therein and a second housing part consisting of an access plate, said access plate being disposable over said aperture.

3. A device according to claim 2 wherein first housing part is configured so as to have a chip mounting area therein for facilitating the positioning of said diode theron, and also having a region for optically aligning said lens with respect to light produced by said diode means.

4. A device according to claim 3 wherein said lens is adjustable with respect to the optical axis of said laser diode means.

5. A device according to claim 3 wherein said lens is hermetically sealable.

6. A device according to claim 3 wherein said access plate and said lens are fixedly secured to said first housing part with an epoxy.

7. A device according to claim 6 wherein said epoxy is UV curable.

8. A device according to claim 2 wherein said access plate is hermetically sealable.

9. A laser diode assembly, comprising:
    laser diode means for producing optical energy;
    lens means for collimating light produced by said laser diode means; and
    a funnel shaped housing means having said diode disposable therein and having said lens optically adjustable with respect to said diode and being mountable within said housing.

10. A device according to claim 7 wherein said socket means is hermetically sealed with respect to said housing means.

11. A laser diode assembly, comprising:
    laser diode means for producing optical energy;
    lens means for collimating light produced by said laser diode means;
    housing means having said diode disposable therein and having said lens optically adjustable with respect to said diode and being mountable within said housing; and
    socket means having said laser diode means disposable thereon, wherein said socket means is disposable within a first open end of said housing means and said first open end of said housing means is crimped so as to fixedly secure said socket means to said housing means.

12. A device according to claim 1 wherein said lens means is hermetically sealed with respect to said housing means.

13. A laser diode assembly, comprising:
    laser diode means for producing optical energy;
    lens means disposable at a second open end of said housing means for collimating light produced by said laser diode means said lens means being optically alignable with respect to light produced by said laser diode means;
    housing means having said diode disposable therein and having said lens optically adjustable with respect to said diode and being mountable within said housing; and
    socket means having said laser diode means disposable thereon, wherein said socket means is disposable within a first open end of said housing means.

* * * * *